United States Patent
Schaffer et al.

(10) Patent No.: US 9,134,501 B2
(45) Date of Patent: Sep. 15, 2015

(54) OPTICAL ELEMENT UNIT AND METHOD OF SUPPORTING AN OPTICAL ELEMENT

(75) Inventors: Dirk Schaffer, Aalen (DE); Willi Heintel, Aalen (DE); Hagen Federau, Augsburg (DE); Joachim Hartjes, Aalen (DE); Harald Kirchner, Munich (DE)

(73) Assignee: Carl Zeiss SMT GmbH, Oberkochen (DE)

(*) Notice: Subject to any disclaimer, the term of this patent is extended or adjusted under 35 U.S.C. 154(b) by 1137 days.

(21) Appl. No.: 11/901,131

(22) Filed: Sep. 14, 2007

(65) Prior Publication Data

US 2009/0147229 A1  Jun. 11, 2009

Related U.S. Application Data

(60) Provisional application No. 60/844,545, filed on Sep. 14, 2006.

(30) Foreign Application Priority Data

Sep. 14, 2006 (EP) ..................................... 06120709

(51) Int. Cl.
G03B 27/68 (2006.01)
G03B 27/52 (2006.01)
(Continued)

(52) U.S. Cl.
CPC ............ *G02B 7/026* (2013.01); *G03F 7/70825* (2013.01); *G02B 7/008* (2013.01)

(58) Field of Classification Search
CPC ............ G03F 7/70825; G03F 7/70833; G03F 7/70891; G03F 7/709; G03F 7/7095; G03F 7/70258; G02B 7/008; G02B 7/02; G02B 7/021; G02B 7/023; G02B 7/026

USPC .............. 355/18, 52, 53, 55, 67–71; 359/811, 359/813, 818–820, 822, 823, 846–849, 359/871–874, 876
See application file for complete search history.

(56) References Cited

U.S. PATENT DOCUMENTS 4,733,945 A * 3/1988 Bacich .......................... 359/820
4,850,674 A * 7/1989 Hasselskog ................... 359/820
(Continued)

FOREIGN PATENT DOCUMENTS

EP  0 230 277 B1  7/1987
EP  1 179 746 A2  2/2002
(Continued)

OTHER PUBLICATIONS

European Search Report from EP 06120709 dated Feb. 14, 2007.
(Continued)

*Primary Examiner* — Christina Riddle
(74) *Attorney, Agent, or Firm* — Fish & Richardson P.C.

(57) ABSTRACT

There is provided an optical element unit comprising an optical element, a connector element, and an optical element holder. The optical element has a plane of main extension as well as an outer circumference and defines a radial direction. The connector element connects the optical element and the optical element holder, the connector element having a first connector part connected to the optical element at the outer circumference and a second connector part connected to the optical element holder. The first connector part and the second connector part are connected via at least one coupling part, the coupling part being compliant in the radial direction and substantially preventing rotation between the first connector part and the second connector part in a plane substantially parallel to the plane of main extension.

42 Claims, 6 Drawing Sheets

(51) Int. Cl.
*G03B 27/54* (2006.01)
*G02B 7/02* (2006.01)
*G03F 7/20* (2006.01)
*G03B 27/42* (2006.01)
*G02B 7/00* (2006.01)

(56) References Cited

U.S. PATENT DOCUMENTS

| | | | | |
|---|---|---|---|---|
| 5,162,951 | A | * | 11/1992 | Sorce ............................ 359/871 |
| 5,249,082 | A | * | 9/1993 | Newman ....................... 359/813 |
| 5,428,482 | A | * | 6/1995 | Bruning et al. ............... 359/827 |
| 5,576,895 | A | * | 11/1996 | Ikeda ............................ 359/811 |
| 5,973,863 | A | * | 10/1999 | Hatasawa et al. ............. 359/823 |
| 6,275,344 | B1 | * | 8/2001 | Holderer ....................... 359/822 |
| 6,392,825 | B1 | | 5/2002 | Trunz et al. ................... 359/819 |
| 6,556,364 | B2 | * | 4/2003 | Meehan et al. ............... 359/822 |
| 6,825,998 | B2 | | 11/2004 | Yoshida ........................ 359/819 |
| 6,859,337 | B2 | | 2/2005 | Oshino et al. ................. 359/819 |
| 6,867,848 | B2 | | 3/2005 | Ebinuma et al. .............. 359/819 |
| 7,006,308 | B2 | | 2/2006 | Sudoh ........................... 359/819 |
| 2001/0039126 | A1 | | 11/2001 | Ebinuma et al. |
| 2002/0085291 | A1 | * | 7/2002 | Dieker .......................... 359/819 |
| 2002/0163741 | A1 | * | 11/2002 | Shibazaki ..................... 359/819 |
| 2003/0234918 | A1 | * | 12/2003 | Watson ......................... 355/53 |
| 2004/0228012 | A1 | * | 11/2004 | Sakamoto ..................... 359/820 |
| 2005/0046815 | A1 | * | 3/2005 | Ebinuma et al. .............. 355/53 |
| 2006/0066963 | A1 | * | 3/2006 | Sudoh ........................... 359/819 |
| 2008/0218721 | A1 | * | 9/2008 | Schoeppach et al. ......... 355/67 |

FOREIGN PATENT DOCUMENTS

| | | |
|---|---|---|
| EP | 1 586 927 | 10/2005 |
| EP | 1 081 521 B | 4/2006 |
| JP | 2001-242364 | 9/2004 |
| JP | 2012-162549 | 8/2012 |
| WO | WO 03/040785 | 5/2003 |
| WO | WO 2005/062100 | 7/2005 |

OTHER PUBLICATIONS

Communication from the Examining Division in corresponding European Patent Application No. EP 06 120 709.8, dated Jan. 7, 2010.

European Search Report (4 pages) in corresponding European Patent Application No. EP 06 120 709.8, dated Jun. 11, 2007.

Communication regarding Transmission of European Search Report (1 page), in corresponding European Patent Application No. EP 06 120 709.8, dated Jun. 11, 2007.

European Search Opinion (9 pages), in corresponding European Patent Application No. EP 06 120 709.8, dated Jun. 11, 2007.

European Office Action for corresponding EP Application No. 06 120 709.8-1524, dated Jun. 7, 2011.

European Office Action for corresponding EP Application No. 12151463.2, dated Mar. 16, 2012.

Japanese Office Action, with translation thereof, for JP Appl No. 2013-148041, dated Jun. 10, 2014.

* cited by examiner

OPTICAL ELEMENT UNIT AND METHOD OF SUPPORTING AN OPTICAL ELEMENT

BACKGROUND OF THE INVENTION

The invention relates to optical element units for exposure processes and, in particular, to optical element units of microlithography systems. It also relates to optical exposure apparatuses comprising such an optical element unit. Furthermore, it relates to methods of supporting an optical element. The invention may be used in the context of photolithography processes for fabricating microelectronic devices, in particular semiconductor devices, or in the context of fabricating devices, such as masks or reticles, used during such photolithography processes.

Typically, the optical systems used in the context of fabricating microelectronic devices such as semiconductor devices comprise a plurality of optical elements, such as lenses and mirrors, gratings etc., in the light path of the optical system. As a part of an illumination system, such optical elements cooperate in an exposure process to project light provided by a light source onto a mask, reticle or the like. As a part of a projection system, such optical elements cooperate in an exposure process to transfer an image formed on the mask, reticle or the like onto a substrate such as a wafer. Said optical elements are usually combined in one or more functionally distinct optical element groups. These distinct optical element groups may be held by distinct optical element units.

Optical element groups comprising at least mainly refractive optical elements, such as lenses, mostly have a straight common axis of symmetry of the optical elements usually referred to as the optical axis. Moreover, the optical element units holding such optical element groups often have an elongated substantially tubular design due to which they are typically referred to as lens barrels.

Due to the ongoing miniaturization of semiconductor devices there is a permanent need for enhanced resolution of the optical systems used for fabricating those semiconductor devices. This need for enhanced resolution obviously pushes the need for an increased numerical aperture and increased imaging accuracy of the optical system. Furthermore, to reliably obtain high-quality semiconductor devices it is not only necessary to provide an optical system showing a high degree of imaging accuracy. It is also necessary to maintain such a high degree of accuracy throughout the entire exposure process and over the lifetime of the system.

One of the problems arising in the context of imaging accuracy is the introduction of stresses into the optical elements via the elements holding the respective optical element. Such stresses introduced into the optical element may have several origins. One origin is the mass distribution of the optical element itself and the location and distribution of the support elements supporting the optical element which leads to a certain mass induced stress distribution within the optical element.

Another origin of such stresses is a difference in the coefficient of thermal expansion between the optical element and its support structure. The difference in the thermal expansion behavior of the optical element and its support structure causes a shift between the optical element and its support structure. Depending on the rigidity of the connection between the optical element, this thermally induced shift is more or less hindered by the connection. A connection that is rigid in the direction of this thermally induced shift leads to an introduction of considerable stresses into the optical element.

In the optical exposure systems mentioned above, this problem mainly arises in the radial direction of the optical element, i.e. in or parallel to the plane of main extension of the optical element.

To deal with this problem it is known, e.g. from U.S. Pat. No. 4,733,945 to Bacich, to provide a ring shaped holder for a lens contacting the lens via a plurality of connector elements. These connector elements are formed monolithically with the holder and adhesively bonded to the outer circumference of the lens. The connector elements comprise a leaf spring part that is compliant in the radial direction of the lens such that the stresses introduced into the lens upon thermally induced expansion are reduced. However, this solution has the disadvantage that, once the adhesive bonding of the lens and the holder is achieved, virtually no further correction or adjustment of the position of the lens relative to the holder is possible anymore at reasonably small effort.

A solution to this problem is known e.g. from U.S. Pat. No. 6,859,337 to Oshino et al. Here, the connector elements comprise two longitudinally aligned leaf spring elements connecting a first connector part attached to a lens to a second connector part connected to a holder ring. The leaf spring elements provide the radial compliance outlined above. The connector elements are not formed monolithically with the holder but removably mounted to the holder. However, this solution has the disadvantage that considerable effort is necessary when mounting the connector elements to the holder ring in order to avoid introduction of pre-stresses and deformations into the leaf spring elements, e.g. due to fastening torques, which may otherwise lead to the introduction of additional stresses into the optical element.

Such stresses introduced into the optical element may cause local anisotropies within the material of the optical element leading to so called stress induced birefringence effects. Among others, such birefringence alters polarization of the light which is of particular disadvantage when occurring in an illumination system.

In this context it has to be noted that the illumination system usually is subject to considerably larger temperature variations during operation of the exposure apparatus than this is the case for the projection system. This is due to the fact that, usually, no active cooling circuitry is provided for the illumination system. Thus, while the temperature deviation of the temperature from a setpoint value in the projection system is kept to be less than 1 K, the temperature deviation in the illumination system usually ranges up to 6 K, sometimes even up to 10 K.

In general, birefringence effects and deformations of the optical elements deteriorate the optical performance of the optical system. Thus, it is desirable to avoid or compensated for these to the highest possible extent.

One approach to avoid such adverse effects is to provide space between the optically used area of the optical element and the contact location of the support structure with the optical element that is sufficiently large for a reduction of the stresses introduced via the support structure. Such a solution is known e.g. from U.S. Pat. No. 6,867,848 B2 to Ebinuma et al. Here an intermediate support ring is adhesively connected to the lens. The intermediate support ring has a coefficient of thermal expansion that corresponds to the coefficient of thermal expansion of the lens. The intermediate support ring is connected to an outer support ring of different coefficient of thermal expansion via radially compliant connectors.

While such an intermediate support ring provides enough space for a reduction of the stresses introduced into it via the external support structure, it has the disadvantage that it is rather costly due to the necessary adaptation of its coefficient

SUMMARY OF THE INVENTION

It is thus an object of the invention to, at least to some extent, overcome the above disadvantages and to provide good and long-term stable and reliable imaging properties of an optical system, in particular of an optical system used in an exposure process.

It is a further object of the invention to easily and reliably reduce the introduction of stresses into the optically used area of an optical element used in an exposure process.

These objects are achieved according to the invention which is based on the teaching that good and long term reliable imaging properties may be achieved if, on the one hand, connector elements are provided having a first connector part contacting the optical element and a second connector part contacting the optical element holder and preventing rotation between the first connector part and the second connector part in a plane substantially parallel to the plane of main extension of the optical element. Preventing such a rotation also prevents the introduction of deformation and pre-stresses, e.g. resulting from fastening torques etc., into the parts connecting the first connector part and the second connector part and, thus, into the optical element.

On the other hand, the invention is based on the teaching that good and long term reliable imaging properties may be achieved if, on the other hand, in an optical element unit, the same plurality of connector elements is provided for a number of optical elements defining an optical element unit axis and the connector elements of one of this a plurality of optical elements are rotated about said optical element unit axis with respect to the connector elements of another one of this a plurality of optical elements in order to compensate for deformation induced imaging errors. The angle of relative rotation between the connector elements of different optical elements depends on the number of connector elements and the number of optical elements participating in the compensation. It will be appreciated that, by this rotation, the imaging errors due to the mass induced deformation of the respective optical element may at least partially compensate each other such that the overall imaging error of the optical system is at least reduced.

Thus, according to a first aspect of the invention there is provided an optical element unit comprising an optical element, a connector element, and an optical element holder. The optical element has a plane of main extension as well as an outer circumference and defines a radial direction. The connector element connects the optical element and the optical element holder, the connector element having a first connector part connected to the optical element at the outer circumference and a second connector part connected to the optical element holder. The first connector part and the second connector part are connected via at least one coupling part, the coupling part being compliant in the radial direction and substantially preventing rotation between the first connector part and the second connector part in a plane substantially parallel to the plane of main extension.

According to a second aspect of the invention there is provided an optical exposure apparatus for transferring an image of a pattern formed on a mask onto a substrate comprising an illumination system providing light of a light path, a mask location located within the light path and receiving the mask, a substrate location located at an end of the light path and receiving the substrate, and an optical projection system located within the light path between the mask location and the substrate location. At least one of the illumination system and the optical projection system comprises an optical element unit according to the first aspect of the invention.

According to a third aspect of the invention there is provided an optical element unit comprising a plurality of N optical elements and at least one optical element holder. Each of the plurality of N optical elements is supported via a plurality of M connector elements on the at least one optical element holder, the connector elements being substantially evenly distributed along an outer circumference of the respective one of the plurality of N optical elements. The plurality of N optical elements define an optical element unit axis. The connector elements of different ones of the plurality of N optical elements are rotated with respect to each other about the optical element unit axis by an angle of relative rotation, the angle of relative rotation substantially corresponding to $$\alpha = \frac{360°}{M \cdot N}$$

in order to provide compensation for deformation induced imaging errors.

According to a fourth aspect of the invention there is provided an optical exposure apparatus for transferring an image of a pattern formed on a mask onto a substrate comprising an illumination system providing light of a light path, a mask location located within the light path and receiving the mask, a substrate location located at an end of the light path and receiving the substrate, and an optical projection system located within the light path between the mask location and the substrate location. At least one of the illumination system and the optical projection system comprises an optical element unit according to the third aspect of the invention.

According to a fifth aspect of the invention there is provided an optical element unit comprising an optical element, a connector element, and an optical element holder. The optical element has a plane of main extension as well as an outer circumference and defines a radial direction. The connector element connects the optical element and the optical element holder, the connector element having a first connector part connected to the optical element at the outer circumference and a second connector part connected to the optical element holder. The first connector part and the second connector part are connected via at least one coupling part, the coupling part being compliant in the radial direction, the first connector part comprising a contact part with at least one contact element, the first connector part being connected to the optical element at a contact location via the at least one contact element. The contact location extends over a fraction of the outer circumference of the optical element, the fraction ranging from 5% to 10%.

According to a sixth aspect of the invention there is provided an optical exposure apparatus for transferring an image of a pattern formed on a mask onto a substrate comprising an illumination system providing light of a light path, a mask location located within the light path and receiving the mask, a substrate location located at an end of the light path and receiving the substrate, and an optical projection system located within the light path between the mask location and the substrate location. At least one of the illumination system and the optical projection system comprises an optical element unit according to the fifth aspect of the invention.

According to a seventh aspect of the invention there is provided a method of supporting an optical element comprising, in a first step, providing the optical element and an optical element holder, the optical element having a plane of main extension as well as an outer circumference and defining a radial direction. In a second step, a connector element is provided and the optical element and the optical element holder are connected via the connector element, the connector element having a first connector part connected to the optical element at the outer circumference and a second connector part connected to the optical element holder. The first connector part and the second connector part are connected so as to provide compliance in the radial direction and to substantially prevent rotation between the first connector part and the second connector part in a plane substantially parallel to the plane of main extension.

According to an eighth aspect of the invention there is provided a method for transferring an image of a pattern formed on a mask onto a substrate comprising providing an illumination system providing light of a light path, providing and locating the mask within the light path, providing and locating the substrate at an end of the light path, providing and locating an optical projection system within the light path between the mask and the substrate, supporting at least one optical element of at least one of the illumination system and the optical projection system using the method according to the seventh aspect of the invention, and transferring an image of the pattern formed on the mask onto the substrate using the illumination system and the optical projection system.

According to a ninth aspect of the invention there is provided a method of supporting a plurality of optical element comprising providing a plurality of N optical elements and providing at least one optical element holder, supporting each of the plurality of N optical elements via a plurality of M connector elements on the at least one optical element holder. The connector elements are substantially evenly distributed along an outer circumference of the respective one of the plurality of N optical elements. The plurality of N optical elements define an optical element unit axis. The supporting each of the plurality of N optical elements comprises rotating the connector elements of different ones of the plurality of N optical elements with respect to each other about the optical element unit axis by an angle of relative rotation, the angle of relative rotation substantially corresponding to $$\alpha = \frac{360°}{M \cdot N}$$

in order to provide compensation for deformation induced imaging errors.

According to a tenth aspect of the invention there is provided a method for transferring an image of a pattern formed on a mask onto a substrate comprising providing an illumination system providing light of a light path, providing and locating the mask within the light path, providing and locating the substrate at an end of the light path, providing and locating an optical projection system within the light path between the mask and the substrate, supporting at least one optical element of at least one of the illumination system and the optical projection system using the method according to the ninth aspect of the invention, and transferring an image of the pattern formed on the mask onto the substrate using the illumination system and the optical projection system.

According to an eleventh aspect of the invention there is provided a method of supporting an optical element comprising in a first step, providing the optical element and an optical element holder, the optical element having a plane of main extension as well as an outer circumference and defining a radial direction, and, in a second step, providing a connector element and connecting the optical element and the optical element holder via the connector element, the connector element being compliant in the radial direction and having a first connector part connected to the optical element at the outer circumference. The first connector part comprises a contact part with at least one contact pad, the first connector part being connected to the optical element at a contact location via the at least one contact pad, the contact location extending over a fraction of the outer circumference of the optical element, the fraction ranging from 5% to 10%.

According to a twelfth aspect of the invention there is provided a method for transferring an image of a pattern formed on a mask onto a substrate comprising providing an illumination system providing light of a light path, providing and locating the mask within the light path, providing and locating the substrate at an end of the light path, providing and locating an optical projection system within the light path between the mask and the substrate, supporting at least one optical element of at least one of the illumination system and the optical projection system using the method according to the eleventh aspect of the invention, and transferring an image of the pattern formed on the mask onto the substrate using the illumination system and the optical projection system.

Preferably, the above aspects of the invention are used in the context of microlithography applications. However, it will be appreciated that the invention may also be used in any other type of optical exposure process.

Furthermore, preferably, the above aspects of the invention are used in the context of the illumination system used in such an optical exposure process. However, it will be appreciated that the invention may also be used in the context of any other optical elements, in particular in the context of projection optics, used in an optical exposure process.

Further embodiments of the invention will become apparent from the dependent claims and the following description of preferred embodiments which refers to the appended figures. All combinations of the features disclosed, whether explicitly recited in the claims or not, are within the scope of the invention.

DETAILED DESCRIPTION OF THE INVENTION

First Embodiment

Figure 1:
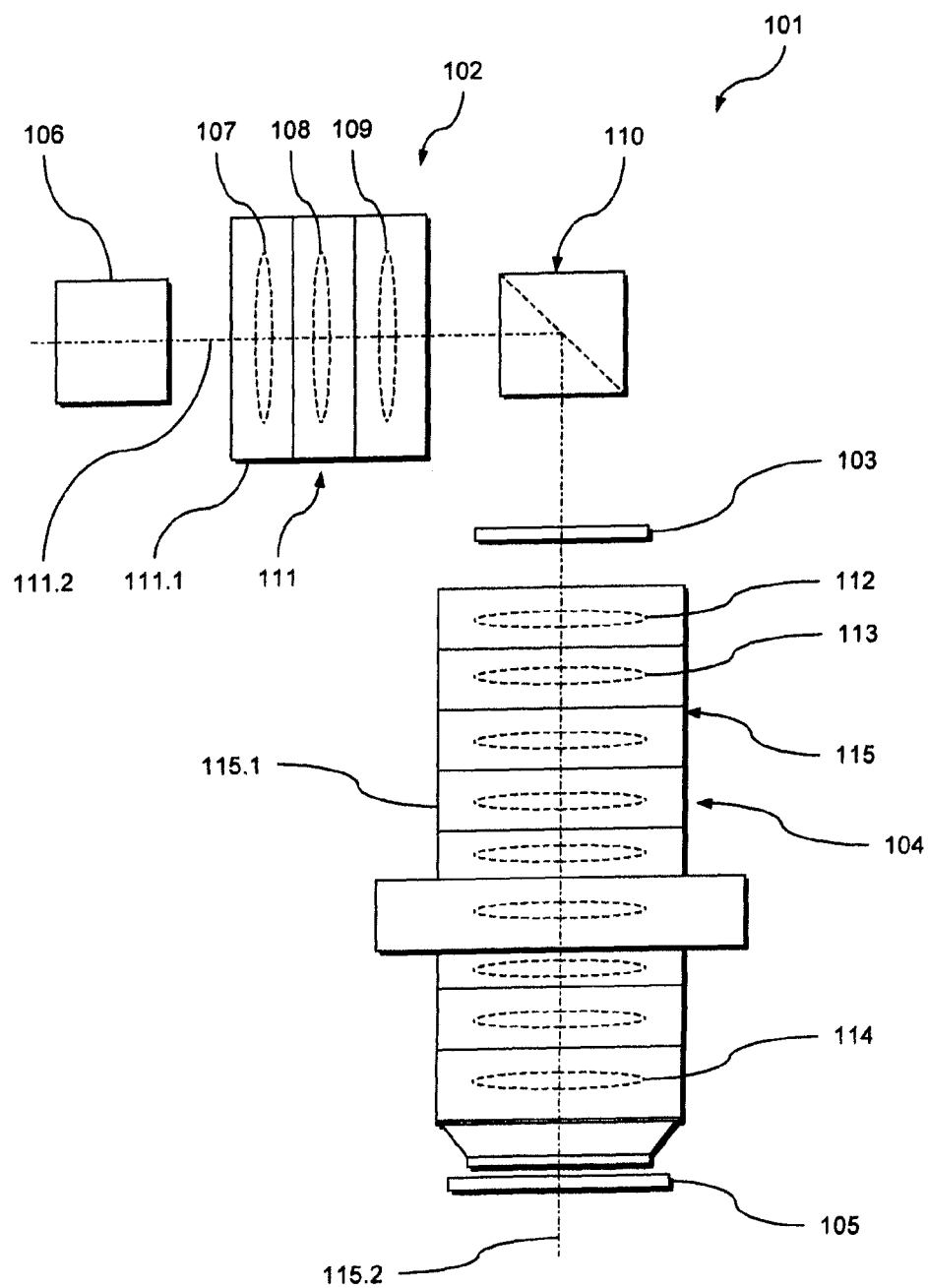
FIG. 1 is a schematic representation of a preferred embodiment of an optical exposure apparatus according to the invention comprising a preferred embodiment of an optical element unit according to the invention.

In the following, a first preferred embodiment of an optical exposure apparatus 101 according to the invention comprising an illumination system 102, a mask 103, an optical projection system 104 and a substrate 105 will be described with reference to FIGS. 1 to 6.

The optical exposure apparatus 101 is adapted to transfer an image of a pattern formed on the mask 103 onto the substrate 105. To this end, the illumination system 102 illuminates the mask 103 with exposure light. The optical projection system 104 projects the image of the pattern formed on the mask 103 onto the substrate 105, e.g. a wafer or the like.

To this end, the illumination system 102 comprises a light source 106 and a plurality of optical elements 107 to 110, such as lenses, mirrors, gratings or the like. The optical elements 107 to 109 are held within a first housing 111.1 of a first optical element unit 111 according to the invention. The optical elements 107 to 110 cooperate to define the beam of exposure light by which the mask 103 is illuminated.

The optical projection system 104 comprises a plurality of optical elements 112 to 114, such as lenses, mirrors, gratings or the like. The optical elements 112 to 114 are held within a second housing 115.1 of a second optical element unit 115 according to the invention. The optical elements 112 to 114 cooperate to transfer an image of the pattern formed on the mask 103 onto the substrate 105.

The optical elements 107 to 109 define a first optical element unit axis 111.2 of substantially horizontal alignment. The optical elements 112 to 114 define a second optical element unit axis 115.2 of substantially horizontal alignment. However, it will be appreciated that, with other embodiments of the invention, any other alignment of the first and second optical axis may be selected.

It should be noted that the shape of the optical elements 107 to 110 and 112 to 114 as well as the shape of the further components of the optical element units 111 and 115 is highly simplified in FIG. 1. It will be appreciated that, in reality, these components may be of an arbitrarily complex design. In particular, the optical elements 107 to 109 and 112 to 114 may have curved surfaces of arbitrarily complex geometry.

Figure 2:
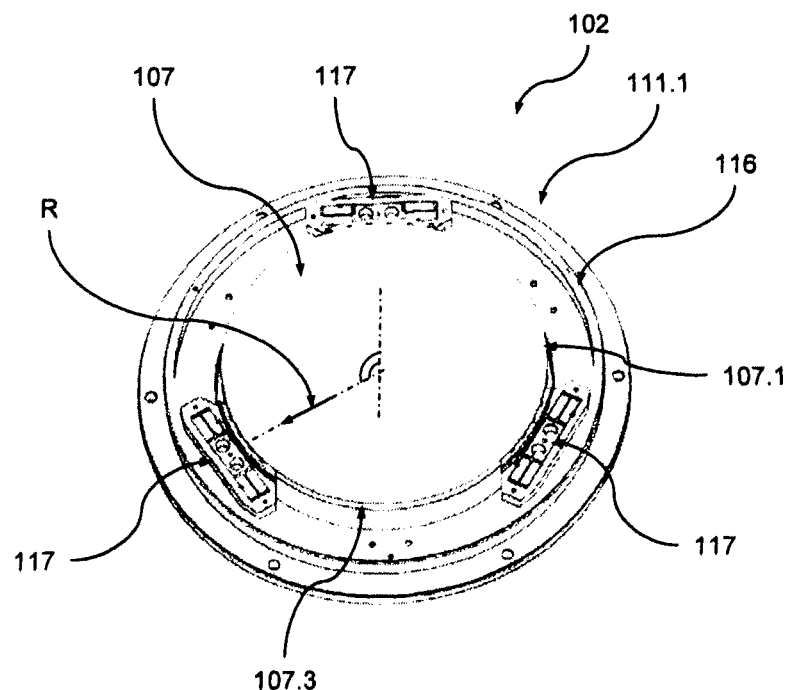
FIG. 2 is a schematic perspective view of a part of the optical element unit of FIG. 1.
Figure 3:
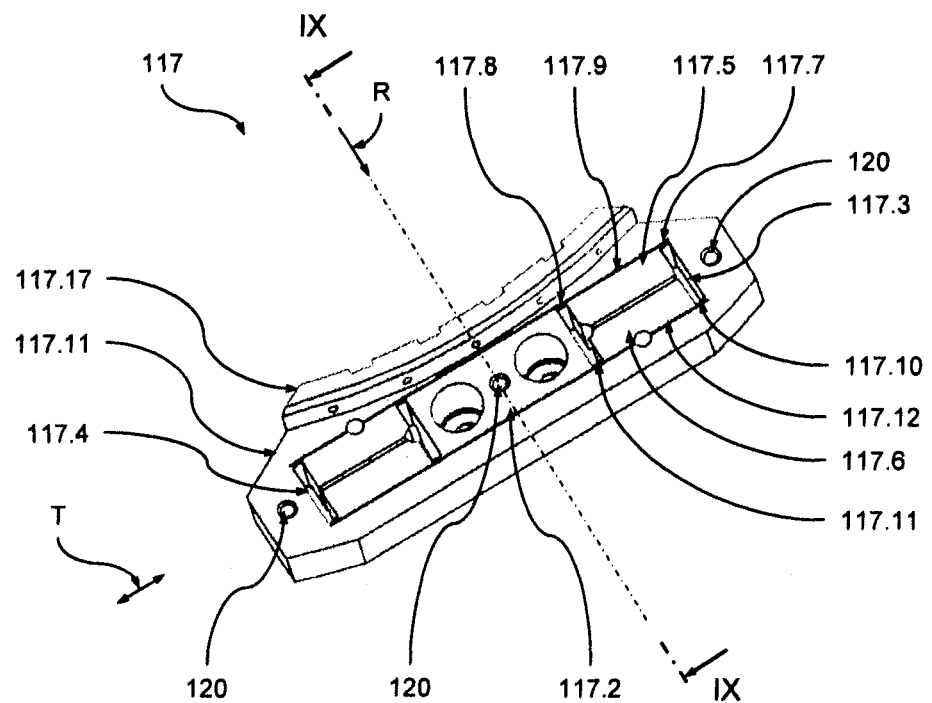
FIG. 3 is a schematic perspective top view of a further part of the optical element unit of FIG. 1.

As can be seen in particular from FIG. 2, the first optical element unit 111 of the illumination system 102 comprises a holder 116. At its outer circumference, the holder 116 is connected to other parts of the housing 111.1 (not shown in FIG. 2). The holder 116 holds the optical element 107 (here a lens) via three connector elements 117 evenly distributed at the outer circumference 107.1 of the lens 107.

The lens 107 has a plane of main extension that is perpendicular to the first optical element unit axis 111.2. The lens 107 is rotationally symmetric and, at each lens point, defines a radial direction R as well as a tangential direction T.

Each connector element 117 comprises a first connector part 117.1 connected to the lens 107 and a second connector part 117.2 connected to the holder 116. The first connector part 117.1, in turn, is connected to the second connector part 117.2 via a first coupling part 117.3 and a second coupling part 117.4. The first coupling part 117.3 and the second coupling part 117.4 are arranged on both sides of the second connector part 117.2 such that they are aligned in the tangential direction T of the lens 107. The first coupling part 117.3 and the second coupling part 117.4 are arranged to symmetric with respect to the second connector part 117.2. Thus, in the following mainly the first coupling part 117.3 will be described.

The first connector part 117.1, the second connector part 117.2, the first coupling part 117.3 and the second coupling part 117.4 are formed monolithically, e.g. by an erosion process from one solid block of suitable material. The first connector part 117.1 has an annular shape surrounding the second connector part 117.2, the first coupling part 117.3 and the second coupling part 117.4. Thus, a highly stable configuration is achieved with a particularly rigid first connector part 117.1.

The first coupling part 117.3 is highly compliant in the radial direction R of the lens 107. The first coupling part 117.3 comprises a first linking element 117.5 and an adjacent second linking element 117.6 being parallel and forming a parallel guide of the first connector part 117.1 with respect to the second connector part 117.2, and vice versa.

To this end, the first linking element 117.5 comprises a thin first flexure 117.7 located adjacent to the first connector part 117.1 and a thin second flexure 117.8 located adjacent to the second connector part 117.2. Between the first flexure 117.7 and the second flexure 117.8 the first linking element 117.5 has a relatively thick and, thus, rigid first middle portion 117.9 that has a bending resistance in a plane parallel to the plane of main extension of the lens 107 that is way higher than the bending resistance of the first flexure 117.7 and the second flexure 117.8 in this plane.

The dimension of each of the first flexure 117.7 and the second flexure 117.8 along the tangential direction T is only about 10% of the entire dimension of the first linking element 117.5 along the tangential direction T. Thus, the first linking element 117.5 is only compliant in the radial direction R while being substantially rigid in any other direction.

Similarly, the second linking element 117.6 comprises a thin third flexure 117.10 located adjacent to the first connector part 117.1 and a thin fourth flexure 117.11 located adjacent to the second connector part 117.2. Between the third flexure 117.10 and the fourth flexure 117.11 the second linking element 117.6 has a relatively thick and, thus, rigid second middle portion 117.12 that has a bending resistance in a plane parallel to the plane of main extension of the lens 107 that is way higher than the bending resistance of the third flexure 117.10 and the fourth flexure 117.11 in this plane.

The dimension of each of the third flexure 117.10 and the second flexure 117.11 along the tangential direction T is only about 10% of the entire dimension of the second linking element 117.6 along the tangential direction T. Thus, the second linking element 117.6 is only compliant in the radial direction R while being substantially rigid in any other direction.

However, it will be appreciated that, with other embodiments of the invention, another design may be chosen for at least one of the linking elements. In particular, at least one of the linking elements may be a simple leaf spring.

The lens 107 is made of a quartz material while the holder 116 is made of a aluminum alloy. Thus, the lens 107 has a much lower coefficient of thermal expansion (about $5.1 \cdot 10^{-7} K^{-1}$) than the holder 116 (about $24.1 \cdot 10^{-6} K^{-1}$). Thus, at a given temperature change within the respective component, the thermal expansion of the lens 107 is much lower than the thermal expansion of the holder 116. To avoid the introduction of large stresses into the lens 107 due to this difference in thermal expansion, the first coupling part 117.3 and the second coupling part 117.4, due to their high compliance in the radial direction R, impose only low resistance to a relative movement between the lens 107 and the holder 116. In the embodiment shown, the rigidity of the first coupling part 117.3 and the second coupling part 117.4 in the radial direction is as low as about 50 N/mm. However, depending on the material used for the connector element, other values of the rigidity in the radial direction may be obtained.

Figure 4:
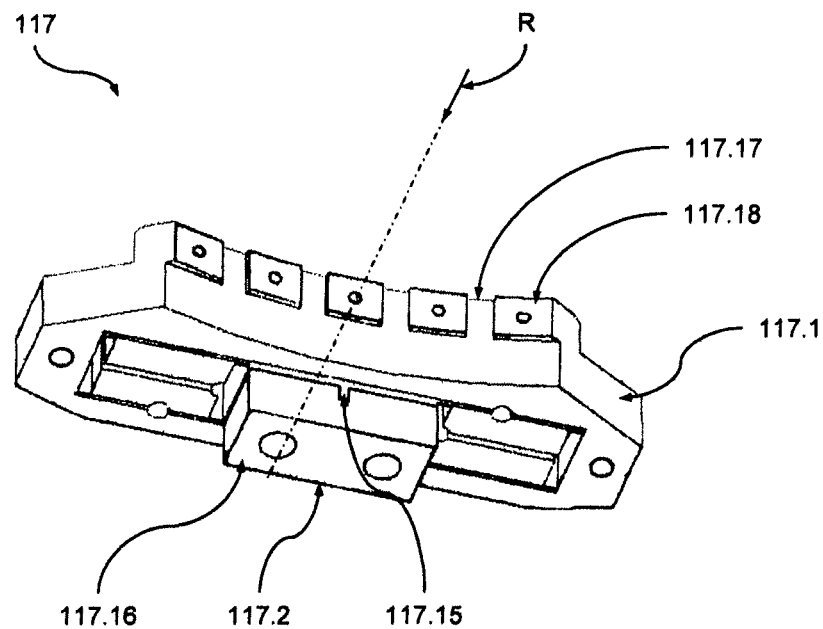
FIG. 4 is a schematic perspective bottom view of the part of FIG. 3.
Figure 5:
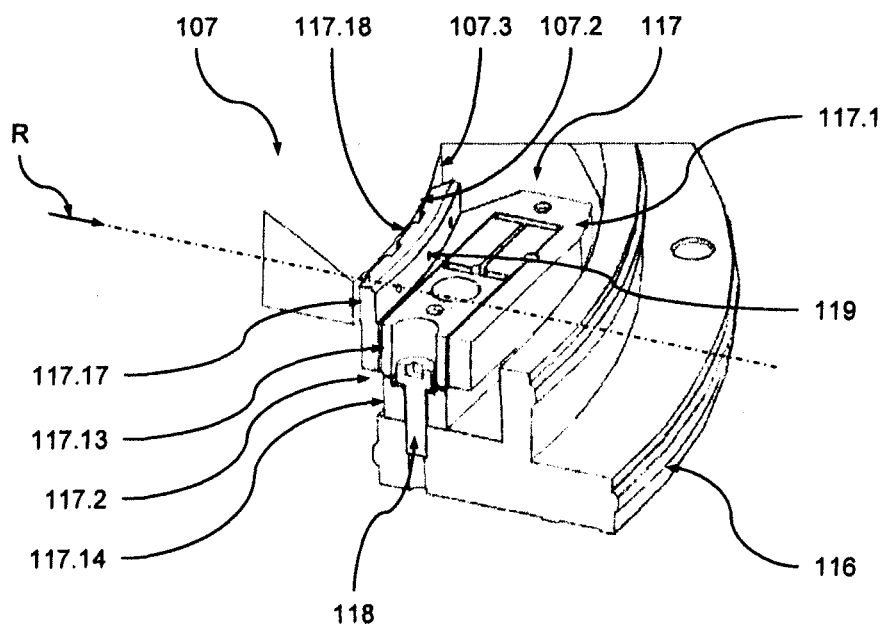
FIG. 5 is a schematic perspective sectional view of a part of the optical element unit of FIG. 1.

As can be seen from FIGS. 4 and 5, in particular, the second connector part 117.2 has a head part 117.13 and a base part 117.14. The head part 117.13 is connected to the first connector part 117.1 via the first coupling part 117.3 and the second coupling part 117.4. The base part 117.14 is connected to the holder 116 via two screws 118. The head part 117.13 and the base part 117.14 are connected via a hinge element 117.15 in the shape of a leaf spring element formed via two L-shaped slots in the second connector part 117.2.

This hinge element 117.15 allows relative rotation of the head part 117.13 and the base part 117.14 about an axis that is substantially parallel to the plane of main extension of the lens 107. Thus, the hinge element 117.15 may compensate for misalignments between the bottom face of the base part 117.14 and the contact surface of the holder 116. Thus, the introduction of considerable stresses into the lens 107 due to such a misalignment is avoided.

The design with the two coupling parts 117.3 and 117.4 arranged in symmetry with respect to the second connector part 117.2 provides a very stable and reliable arrangement. However, it will be appreciated that, with other embodiments of the invention, one single coupling part connecting the first and the second connector part may be sufficient. Furthermore, it will be appreciated that any other type of parallel guide mechanism between the first and the second connector part preventing relative rotation of the first and the second connector part in the plane of main extension of then lens 107 may be chosen.

As can be seen from FIGS. 4 and 5, in particular, the first connector part 117.1 comprises a contact part 117.17 with five contact elements formed by five contact pads 117.18 separated along the circumference of the lens. The lens 107 is connected to the contact part 117.17 at a contact location 107.2 of a contact surface 107.3 of the lens 107. The contact surface 107.3 is a substantially cylindrical surface that extends perpendicular to the plane of main extension of the lens and is located at the outer circumference of the lens 107.

The contact part 117.17 and the five contact pads 117.18 have a curvature that conforms to the curvature of the contact surface 107.3 of the lens 107. A small gap is formed between the contact pads 117.18 and the contact surface 107.3 of the lens 107. An adhesive is filled into the respective gap via filling holes 119 reaching through the contact part 117.17 in the region of each contact pad 117.18. The adhesive is then cured to bond the contact part 117.17 to the lens 107.

According to one aspect of the invention the respective contact part 117.17 extends over about 8% of the outer circumference of the lens 107. However, with other embodiments of the invention, the contact location of the lens with the respective connector element may extend over other fractions of the outer circumference of the lens, preferably ranging from 5% to 10%. This has the advantage that, while maintaining a three point support to the lens 107 via the connector elements 117, the contact area with the lens 107 is relatively wide such that the stresses introduced into the lens 107 are distributed over a relatively wide area and, consequently, the deformation of the lens 107 is kept low.

The spaced apart contact pads have the advantage that, while guaranteeing a stable connection between the lens 107 and the connector element 117, this connection is not provided via one single continuous layer of adhesive. Thus, shrinkage, ageing or other alterations within the adhesive do not introduce shear loads into the lens 107 over one single continuous area but via a plurality of small contact areas leading to a reduction of the stresses introduced into the lens 107 due to such effects.

The connector element 117 is made of Invar having a coefficient of thermal expansion (about $1.6 \cdot 10^{-6} K^{-1}$) that is closer to the one of the lens 107. This reduces the introduction of stresses into the lens 107 due to differences in the thermal expansion behavior between the lens 107 and the connector element 117. This also reduces the shear stresses the adhesive has to take upon thermal expansion of the components.

For mounting the connector element 117 to the holder 116, the base part 117.14 is screwed to the holder 116 via two screws 118. When tightening the screws 118, the tightening torque causes a deformation of the second coupling part which, in the devices known in the art, might cause deformation of the coupling parts leading to a relative rotation between the first connector part 117.1 and the second connector part 117.2 in a plane substantially parallel to the plane of main extension of the lens 107. Such a relative rotation between the first connector part 117.1 and the second connector part 117.2 would lead to the introduction of additional stresses into the lens 107 which, in turn would deteriorate the optical performance of the system.

According to one aspect of the invention, the parallel guide mechanisms provided by the first coupling part 117.3 and the second coupling part 117.4 prevent such relative rotation between the first connector part 117.1 and the second connector part 117.2 in a plane substantially parallel to the plane of main extension of the lens 107. Thus, the introduction of stresses due to such mounting actions is reduced and less effort is necessary to avoid such stresses during assembly of the optical element unit 111.

It will be appreciated that the releasably mounted connector elements 117 allow readjustment of the assembly at a later point in time by temporarily releasing the screws 118 of one or more of the connector elements 117. In order to further facilitate mounting and/or readjustment of the respective connector element 117, a mounting assistance in the form of a simple elongated plate—not shown—may be mounted to the connector element 117. The mounting assistance overlaps the connector element 117 and is fixed to the first connector part 117.1 and the second connector part 117.2 via screws engaging the threaded bores and, thus, fixing the relative position between the first connector part 117.1 and the second connector part 117.2. Of course, instead of the screw connection, any other suitable connection providing the fixation of the relative position between the first connector part 117.1 and the second connector part 117.2 may be chosen.

Figure 6:
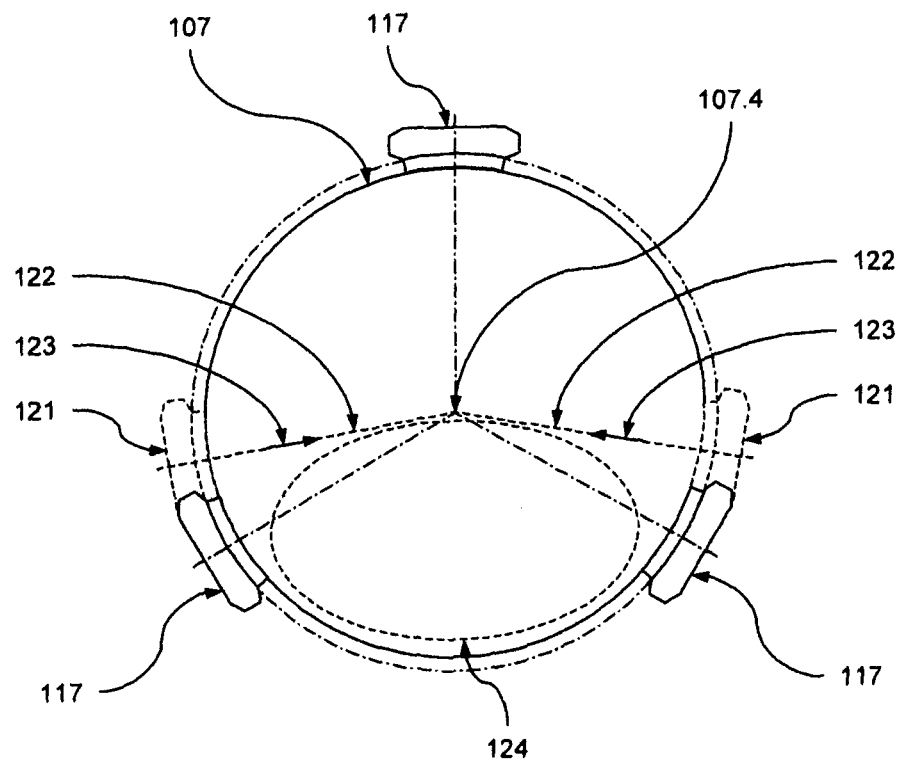
FIG. 6 is a schematic representation of the relative arrangement of components of the optical element unit of FIG. 1.

As can be seen from FIG. 6, showing a schematic view of the lens 107 and its mounted connector elements 117 along the first optical element unit axis 111.2, the standing lens 107 (i.e. having a plane of main extension of vertical arrangement) is supported from below by two connector elements 117 and held from above by one connector element 117.

As indicated in FIG. 6 by the dashed contours 121, according to a further aspect of the invention, the connector elements, other variants of the invention with only partial optical use of the lens 107, may be arranged such that the holding force lines 122 of the holding force components 123, exerted onto the lens 107 by the connector elements in parallel to the plane of main extension of the lens 107, lie outside the optically used area 124. This is achieved by a configuration wherein the optically used area does not contact the parts of the holding force lines between the respective connector element (indicated by the contours 121) and the intersection location of the holding force lines 122.

In other words, as indicated in FIG. 6, the optically used area 124 of the lens 107 is arranged eccentrically with respect to the intersection location of the holding force lines 122. Here, this intersection location lies on the center 107.4 of the lens 107. However, in particular with non rotationally symmetric optical elements, the intersection location may be located at any other suitable location as well.

With the standing arrangement of the lens 107, the lower connector elements (indicated by the contours 121) exert the a holding force component at any time. However, it will be appreciated that this principle may, of course, also be applied to optical elements of any other orientation of the plane of main extension, in particular of horizontal orientation. Thus, these holding force components may as well only arise upon thermally induced expansion of the optical element.

Figure 7:
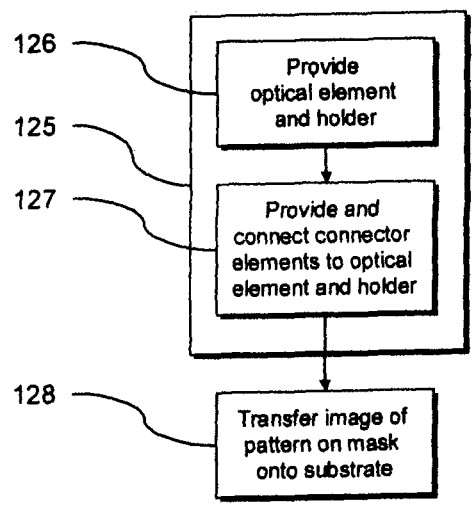
FIG. 7 is a block diagram of a preferred embodiment of a method of transferring an image of a pattern formed on a mask onto a substrate according to the invention comprising a preferred embodiment of a method of supporting an optical element according to the invention.

FIG. 7 shows a block diagram of a preferred embodiment of a method of supporting an optical element according to the invention that is used during operation of the optical exposure apparatus 101, i.e. when the image of the pattern formed on the mask 103 is transferred onto the substrate 105 according to the corresponding method according to the invention.

In a first step 125, the illumination system 102, including the first optical element unit 111, the mask 103, the optical projection system 104 and the substrate 105 are provided, In a first partial step 126 of this step 125, the optical element 107 and the holder 116 having the features as outlined above are provided. In a second partial step 127 of this step 125, the connector elements 117 having the features as outlined above are provided and connected to the optical element 107 and the holder 116 to provided the arrangement as outlined above. After providing, in further partial steps, all the further components of the optical exposure apparatus 101, in a step 128, the image of the pattern formed on the mask 103 is transferred onto the substrate 105 using the illumination system 102 with the optical element 107 and the optical projection system 104.

Second Embodiment

In the following, a second preferred embodiment of an optical element unit according to the invention in the form of the second optical element unit 115 will be described with reference to FIGS. 1 and 8.

Figure 8:
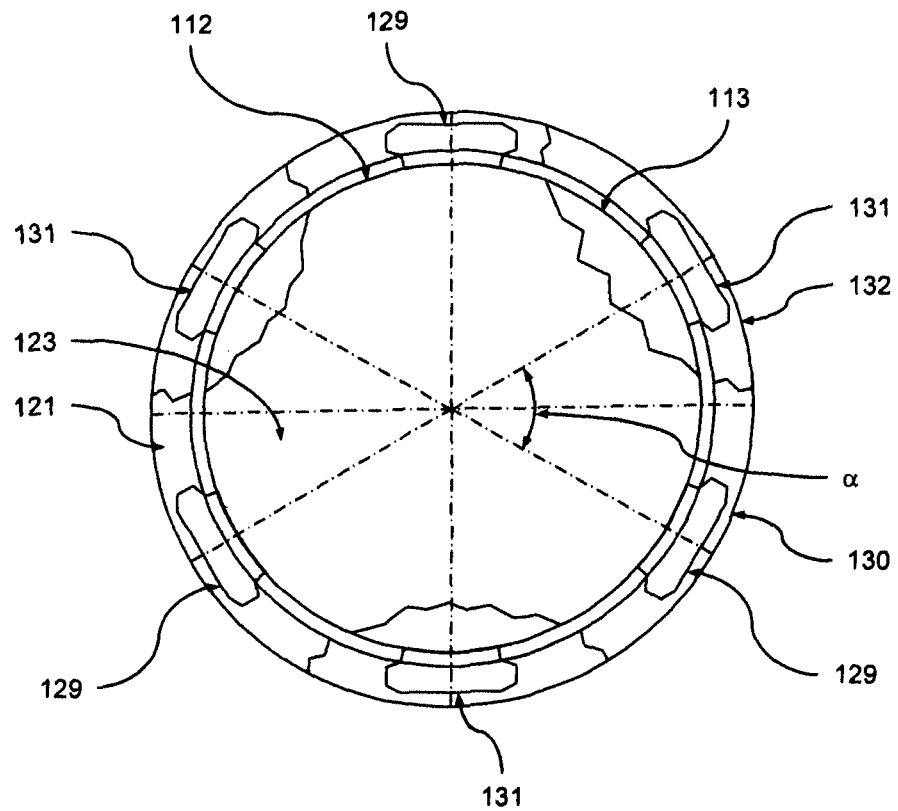
FIG. 8 is a schematic representation of the relative arrangement of components of a further preferred embodiment of an optical element unit according to the invention.

FIG. 8 shows a schematic partial view of the second optical element unit 115 from above along the second optical element unit axis 115.2. More specifically, FIG. 8 shows a schematic view of a first optical element in the form of lens 112 with its first connector elements 129 mounted to a first holder 130 and a second optical element in the form of lens 113 with its second connector elements 131 mounted to a second holder 132.

The first connector elements 129 and the second connector elements 131 correspond to the connector elements 117 such that, with respect to their design and functionality, it is here only referred to the explanations given above with respect to the connector elements 117. Furthermore, the first holder 130 and the second holder 132 correspond to the holder 116 such that, with respect to their design and functionality, it is here only referred to the explanations given above with respect to the holder 116. Again, the first connector elements 129 and the second connector elements 131 are evenly distributed along the circumference of the first lens 112 and the second lens 113, respectively.

As already mentioned, here as well, according to one aspect of the invention, the respective contact part of the respective connector element 129, 131 extends over about 8% of the outer circumference of the respective lens 112, 113. However, with other embodiments of the invention, the contact location of the lens with the respective connector element may extend over other fractions of the outer circumference of the lens, preferably ranging from 5% to 10%. This has the advantage that, while maintaining a three point support to the respective lens 112, 113 via the connector elements 129, 131, the contact area with the lens 112, 113 is relatively wide such that the deformation in the circumferential direction of the lens—induced by the mass distribution of the lens 112, 113, respectively, and resulting in a so called waviness deformation of the lens 112, 113, respectively—is reduced leading, in turn, to a reduced imaging error due to this kind of deformation.

To further reduce the overall imaging error of the optical projection system 104 resulting from this waviness deformation, the first connector elements 129 and the second connector elements 131 are rotated with respect to each other about an angle of relative rotation following the common equation:

$$\alpha = \frac{360°}{M \cdot N}, \quad (1)$$

wherein N is the number of optical elements participating in the compensation and M is the number of connector elements of each optical element participating in the compensation. Thus, in the embodiment shown—where M=2 and N=3—the first connector elements 129 and the second connector elements 131 are rotated with respect to each other about an angle of relative rotation about the second optical element axis 115.2 corresponding to $$\alpha = \frac{360°}{M \cdot N} = \frac{360°}{2 \cdot 3} = 60°,$$

Thus, the effects of the waviness deformation of the first lens 112 and the second lens 113, in the optimal case cancel out each other, or, where the waviness and the associated respective imaging error have different amplitudes for the first and second lens 112, 113, at least a partial compensation may be achieved.

It will be appreciated that, with other embodiments of the invention, the optical elements participating in the compensation do not have to be neighbors. It is also possible that they are separated along the optical element unit axis by other optical elements. For example, the first lens 112 and the last lens 114 might also be participating in such a compensation. Furthermore, as already indicated by the universality of equation 1, another number of optical elements as well as another number of connector elements may be used in such a compensation.

Third Embodiment

In the following, a third preferred embodiment of an optical element unit according to the invention in the form of an optical element unit 211 will be described with reference to FIGS. 1 and 9. The optical element unit 211 may replace the optical element unit 111 in the optical exposure apparatus 101 of FIG. 1. The optical element unit 211, in its basic design and functionality, largely corresponds to the optical element unit 111 such that it will here be mainly referred to the differences. In particular, like parts have been given the same reference numerals raised by the amount 100.

Figure 9:
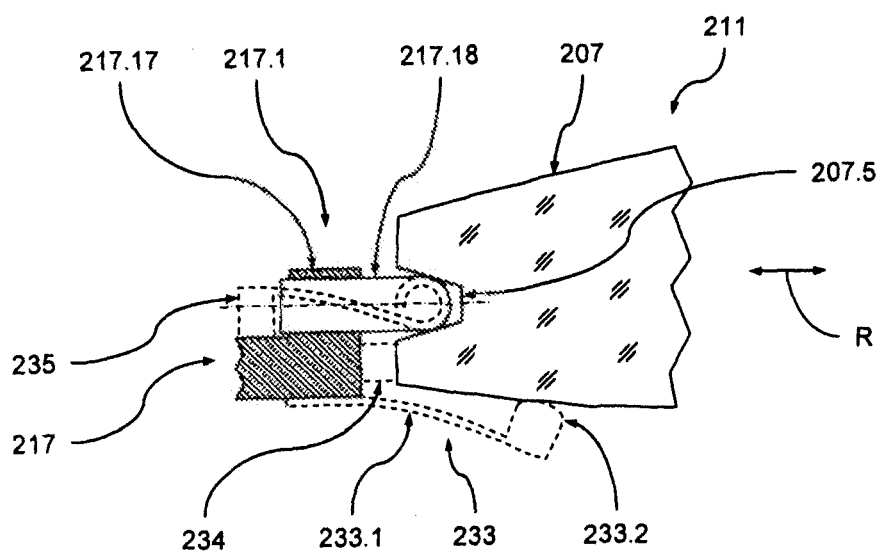
FIG. 9 is a schematic sectional representation of a part of a further preferred embodiment of an optical element unit according to the invention.

FIG. 9 shows a schematic partial sectional view (corresponding to a section along line IX-IX of FIG. 3) of the connector element 217 of the optical element unit 211. The only difference of the connector element 217 with respect to the connector element 117 of the optical element unit 111 lies within the design of the contact part 217.17 of the first connector part 217.1.

The first connector part 217.1 comprises a contact part 217.17 with a (releasably mounted) contact element 217.18 adjustably protruding (in the radial direction R) into a circumferential recess or groove 207.5 formed within the lens 207. However, it will be appreciated that, with other embodiments of the invention, the protrusion may be formed at the optical element while the mating recess is formed at the first connector part.

The contact element 217.18 together with the contact elements of the other connector elements 217 contacting the lens 207 exerts the forces holding the lens via, both, a positive connection (e.g. along the optical axis of the lens 207) and a frictional connection (e.g. along the circumferential direction of the lens 207).

Apart from the contact element 217.18 replacing one of the contact pads 117.18 the first connector element 217 is identical to the connector element 117 as described in the context of the first embodiment. It will be appreciated that, with other embodiments of the invention, further ones of the contact pads 117.18 (even up to all contact pads 117.18) may each be replaced by such an adjustable contact element.

In cases where the lens 207 is mounted such that its plane of main extension is parallel or slightly inclined with respect to the horizontal plane of the lens 207 may be further supported by one or a plurality of leaf spring elements mounted to the contact part 217.17 and compensating (in a well-known manner) at least a part of the gravitational force acting on the lens 207 as it is indicated by the dashed contour 233 in FIG. 9.

The leaf spring element 233 has a leaf spring section 233.1 mounted at one end to the contact part 217.17. A contact head 233.2 contacting the lens 207 is arranged at the other end of the leaf spring element 233. The contact head 233.2 may contact the lens in an exclusively frictional contact or may be adhesively connected to the lens 207.

The leaf spring element 233 does not necessarily have to contact the lower optical surface of the lens 207. For example, with other embodiments of the invention, it is also possible that the leaf spring element mounted to be contact part of 217.17 protrudes (in the radial direction R) into the groove 207.5 of the lens 207 to provide a contact with the lens 207 in a manner as it is indicated by the dashed contour 235 in FIG. 9 and as it is known from U.S. Pat. No. 7,006,308 B2 (Sudoh), the entire disclosure of which is incorporated herein by reference.

Furthermore, in addition or as an alternative to the leaf spring(s) 233, contact pads 234 providing an adhesive connection between the lens 207 and the contact part 217.17 may be provided. Such a solution of course may be selected irrespective of the spatial orientation of the lens 207.

Furthermore, it will be appreciated that, with other embodiments of the invention, the leaf spring(s) 233 (either alone or in combination with the contact pads 234) may be used as an alternative to the contact elements 217.18 (i.e. the contact elements 217.18 may be omitted in this case).

Fourth Embodiment

In the following, a fourth preferred embodiment of an optical element unit according to the invention in the form of an optical element unit 311 will be described with reference to FIGS. 1 and 10. The optical element unit 311 may replace the optical element unit 111 in the optical exposure apparatus 101 of FIG. 1. The optical element unit 311, in its basic design and functionality, largely corresponds to the optical element unit 111 such that it will here be mainly referred to the differences. In particular, like parts have been given the same reference numerals raised by the amount 200.

Figure 10:
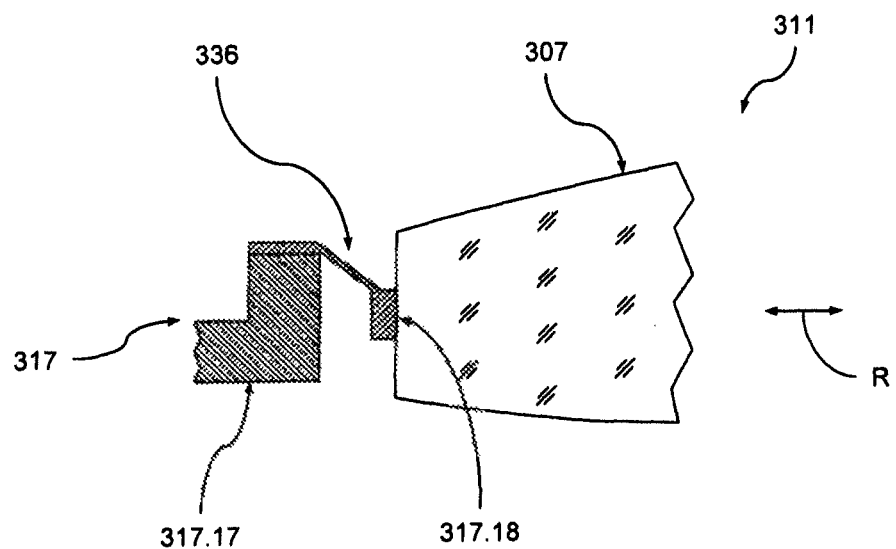
FIG. 10 is a schematic sectional representation of a part of a further preferred embodiment of an optical element unit according to the invention.

FIG. 10 shows a schematic partial sectional view (corresponding to a section along line IX-IX of FIG. 3) of the connector element 317 of the optical element unit 311. The only difference of the connector element 317 with respect to the connector element 117 of the optical element unit 111 lies within the design of the contact part 317.17 of the first connector part 317.1. More precisely, the respective contact pad 317.18 (replacing the contact pads 117.18) via which the connector element of 317 is adhesively bonded to the lens 307 is formed at one end of a leaf spring element 336 (arranged to be compliant in the radial direction R). At its other end, the leaf spring element 336 is (eventually releasably) connected to the contact part 317.17. Thus, in other words, a connection between the contact part 317.17 and the lens 307 is provided which is similar to the one known from U.S. Pat. No. 6,825,998 B2 (Yoshida), the entire disclosure of which is incorporated herein by reference.

Apart from the leaf spring element 336 replacing the respective contact pad 117.18 the first connector element 317 is identical to the connector element 117 as it has been described in the context of the first embodiment.

Fifth Embodiment

In the following, a fifth preferred embodiment of an optical element unit according to the invention in the form of an optical element unit 411 will be described with reference to FIGS. 1 and 11. The optical element unit 411 may replace the optical element unit 111 in the optical exposure apparatus 101 of FIG. 1. The optical element unit 411, in its basic design and functionality, largely corresponds to the optical element unit 111 such that it will here be mainly referred to the differences. In particular, like parts have been given the same reference numerals raised by the amount 300.

Figure 11:
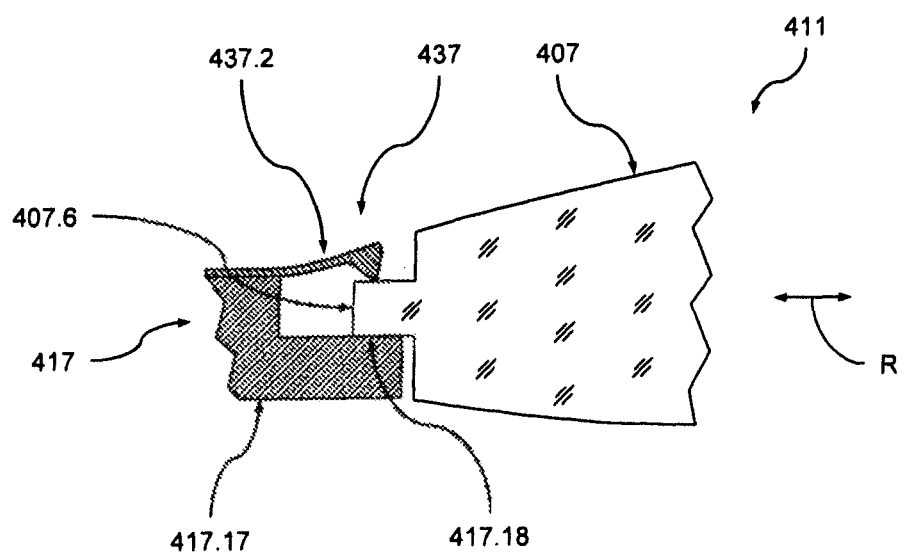
FIG. 11 is a schematic sectional representation of a part of a further preferred embodiment of an optical element unit according to the invention.

FIG. 11 shows a schematic partial sectional view (corresponding to a section along line IX-IX of FIG. 3) of the connector element 417 of the optical element unit 411. The only difference of the connector element 417 with respect to the connector element 117 of the optical element unit 111 lies within the design of the contact part 417.17 of the first connector part 417.1. More precisely, the contact between the lens 407 and the contact part 417.17 is provided by a clamping arrangement 437 (replacing the contact pads 117.18). The clamping arrangement comprises a support surface 417.18 formed at the contact part 417.17 and an associated clamping element 437.1 clamping (in a well-known manner) a radial protrusion 407.6 of the lens 407.

While in the embodiment shown only one such clamping arrangement 437 is provided, it will be appreciated that, with other embodiments of the invention, a plurality of such clamping arrangements may be provided at the respective connector element.

Apart from the leaf spring element 336 replacing the respective contact pad 117.18 the first connector element 317 is identical to the connector element 117 as it has been described in the context of the first embodiment.

In the foregoing, the invention has been described only in the context of an applications with an illumination 102 system with standing optical elements and an optical projection system 104 with lying optical elements. However, it will be appreciated that invention may also be applied to illumination systems and optical projection systems with optical elements of different orientation.

Furthermore, it will be appreciated that the invention may be used in the context of any rotationally symmetric or non-rotationally symmetric shape of the optical element. Thus, for example, the optical element may have an at least partly arbitrarily curved and/or an at least partly polygonal shape in its plane of main extension.

Finally, in the foregoing, the invention has been described only in the context of microlithography applications. However, it will be appreciated that the invention may be used in the context of any other imaging process.

What is claimed is:

1. An optical element unit comprising:
   an optical element;
   a plurality of connector elements; and
   an optical element holder,
   wherein:
   said optical element has a plane of main extension as well as an outer circumference and defines a radial direction;
   said optical element is connected to said optical element holder exclusively by said connector elements;
   each of said connector elements has a first connector part connected to said optical element at said outer circumference and a second connector part connected to said optical element holder;
   said first connector part and said second connector part are connected via at least one coupling part arranged kinematically in series between said first connector part and said second connector part;
   said at least one coupling part is compliant in said radial direction and is configured to substantially prevent rotation between said first connector part and said second connector part in a plane substantially parallel to said plane of main extension;
   said at least one coupling part is substantially rigid in a direction perpendicular to said plane of main extension of said optical element;
   said at least one coupling part is a parallel guide configured to provide parallel guidance of said first connector part relative to said second connector part along said radial direction in said plane substantially parallel to said plane of main extension; and
   said optical element unit is a microlithography optical element unit.

2. The optical element unit according to claim 1, wherein:
   said at least one coupling part comprises a first linking element and a second linking element;
   said first linking element links said first connector part and said second connector part;
   said second linking element links said first connector part and said second connector part; and
   said first linking element and said second linking element are substantially parallel.

3. The optical element unit according to claim 2, wherein:
   said first linking element comprises a first leaf spring element;
   said second linking element comprises a second leaf spring element; and
   said first leaf spring element and said second leaf spring element are substantially parallel.

4. The optical element unit according to claim 3, wherein at least one of the following conditions holds:
   said first linking element comprises a first middle portion located between a first flexure and a second flexure, said first middle portion having a bending resistance in a plane parallel to said optical element plane that is larger than the bending resistance of said first flexure and said second flexure in said plane parallel to said optical element plane; and
   said second linking element comprises a second middle portion located between a third flexure and a fourth flexure, said second middle portion having a bending resistance in a plane parallel to said optical element plane that is larger than the bending resistance of said first flexure and said second flexure in said plane parallel to said optical element plane.

5. The optical element unit of claim 2, wherein:
   said first linking element comprises a first flexure located adjacent to said first connector part and a second flexure located adjacent to said second connector part; and
   said second linking element comprises a third flexure located adjacent to said first connector part and a fourth flexure located adjacent to said second connector part.

6. The optical element unit according to claim 1, wherein:
   said at least one coupling part is a first coupling part;
   said first connector part and said second connector part are connected via a second coupling part;
   said second coupling part is compliant in said radial direction and is configured to substantially prevent rotation between said first connector part and said second connector part in a plane substantially parallel to said plane of main extension; and
   said first coupling part and said second coupling part are arranged substantially symmetrical with respect to said second connector part.

7. The optical element unit according to claim 1, wherein said second connector part comprises a base part, a head part and a hinge element;
   said base part being connected to said optical element holder;
   said head part being connected to said at least one coupling part;
   said hinge element connecting said base part and said head part and allowing relative rotation between said base part and said head part about an axis substantially parallel to said radial direction;
   said hinge element comprises at least one of at least one flexure and at least one leaf spring element; and
   said base part is connected to said optical element holder via at least one screw connection.

8. The optical element unit according to claim 1, wherein:
   said first connector part comprises a contact part with at least one contact element;
   said first connector part is connected to said optical element at a contact location via said at least one contact element;
   said at least one contact element is at least one of a contact pad, a protrusion engaging a mating recess of said optical element, and a recess engaging a mating protrusion of said optical element.

9. The optical element unit according to claim 8, wherein:
said at least one contact element is a contact pad;
at least one of said contact part and said contact pad is adapted to a curvature of said optical element at said contact location;
said first connector part comprises a plurality of contact pads; and
said contact pads are spaced apart along said outer circumference of said optical element.

10. The optical element unit according to claim 1, wherein said first connector part is connected to said optical element via at least one of an adhesive bond, a positive connection and a frictional connection.

11. The optical element unit according to claim 1, wherein:
said optical element has a contact surface extending substantially perpendicular to said plane of main extension; and
said first connector part is connected to said optical element at said contact surface.

12. The optical element unit according to claim 1, wherein said connector elements are distributed along said outer circumference of said optical element.

13. The optical element unit according to claim 12, wherein said optical element unit has an optically used area, and wherein at least one of the following conditions holds:
each of said connector elements, at least upon thermally induced expansion of said optical element, exerts a holding force component onto said optical element, said holding force component lying on a holding force line in a plane parallel to said plane of main extension, said holding force lines intersecting at an intersection location, and said connector elements being distributed along said outer circumference of said optical element such that said optically used area is arranged eccentrically with respect to said intersection location; and
each of said connector elements, at least upon thermally induced expansion of said optical element, exerts a holding force component onto said optical element, said holding force component lying on a holding force line in a plane parallel to said plane of main extension, and said connector elements being distributed along said outer circumference of said optical element such that said optically used area does not contact the parts of said holding force lines between the respective connector element and an intersection location of said holding force lines.

14. The optical element unit according to claim 1, wherein:
said optical element is a first optical element;
said optical element holder is a first optical element holder;
a plurality of N optical elements is provided;
said first optical element is part of said plurality of N optical elements;
each of said plurality of N optical elements is supported via a plurality of M connector elements on one of said first optical element holder and at least one second optical element holder;
said connector elements are substantially evenly distributed along an outer circumference of the respective one of said plurality of N optical elements;
said plurality of N optical elements define an optical element unit axis;
said connector elements of different ones of said plurality of N optical elements are rotated with respect to each other about said optical element unit axis by an angle of relative rotation; and
said angle of relative rotation substantially corresponds to $\alpha = 360°/(M*N)$ in order to provide compensation for deformation induced imaging errors.

15. The optical element unit according to claim 14, wherein at least one of the following conditions holds:
along said optical element unit axis, at least one of at least two optical elements of said plurality of N optical elements are separated by at least one optical element, and at least two optical elements of said plurality of N optical elements are located adjacent to each other; and
said angle of relative rotation of said connector elements of at least one of said plurality of N optical elements is adjustable in order to adjust said compensation for deformation induced imaging errors.

16. The optical element unit according to claim 1, wherein said optical element does not directly contact said optical element holder.

17. An optical exposure apparatus, comprising:
an illumination system configured to provide light of a light path, a mask location being located within said light path, and a substrate location being located at an end of said light path; and
an optical projection system located within said light path between said mask location and said substrate location, wherein:
at least one of said illumination system and said optical projection system comprises an optical element unit comprising an optical element, a plurality of connector elements, and an optical element holder;
said optical element has a plane of main extension as well as an outer circumference and defines a radial direction;
said optical element is connected to said optical element holder exclusively by said connector elements;
each of said connector elements has a first connector part connected to said optical element at said outer circumference and a second connector part connected to said optical element holder;
said first connector part and said second connector part are connected via at least one coupling part arranged kinematically in series between said first connector part and said second connector part;
said at least one coupling part is compliant in said radial direction and is configured to substantially prevent rotation between said first connector part and said second connector part in a plane substantially parallel to said plane of main extension;
said at least one coupling part is substantially rigid in a direction perpendicular to said plane of main extension of said optical element;
said at least one coupling part is a parallel guide configured to provide parallel guidance of said first connector part relative to said second connector part along said radial direction in said plane substantially parallel to said plane of main extension;
said optical exposure apparatus is configured so that, during use, said optical exposure apparatus can transfer an image of a pattern in said mask location into said substrate location; and
said optical exposure apparatus is a microlithography optical exposure apparatus.

18. The optical exposure apparatus according to claim 17, wherein said plane of main extension is inclined with respect to a horizontal plane.

19. The optical exposure apparatus according to claim 17, wherein said optical element does not directly contact said optical element holder.

20. An optical element unit comprising:
an optical element,
a plurality of connector elements, and
an optical element holder,
wherein:
said optical element has a plane of main extension as well as an outer circumference and defining a radial direction;
said optical element is connected to said optical element holder exclusively by said connector elements;
each of said connector elements has a first connector part connected to said optical element at said outer circumference and a second connector part connected to said optical element holder;
said first connector part and said second connector part are connected via at least one coupling part arranged kinematically in series between said first connector part and said second connector part;
said at least one coupling part is compliant in said radial direction;
said at least one coupling part is a parallel guide configured to provide parallel guidance of said first connector part relative to said second connector part along said radial direction in said plane substantially parallel to said plane of main extension;
said first connector part comprises a contact part with at least one contact element;
said first connector part is connected to said optical element at a contact location via said at least one contact pad;
said contact location extends over a fraction of said outer circumference of said optical element, said fraction ranging from 5% to 10%; and
said optical element unit is a microlithography optical element unit.

21. The optical element unit according to claim 20, wherein said fraction ranges from 7% to 8.5%.

22. The optical element unit according to claim 20, wherein at least one of the following conditions holds:
at least one of said contact part and said contact element is adapted to a curvature of said optical element at said contact location; and
said first connector part comprises a plurality of contact elements; said contact elements being spaced apart along said outer circumference of said optical element; and
said first connector part is connected to said optical element via at least one of an adhesive bond, a positive connection and a frictional connection.

23. The optical element unit according to claim 20, wherein:
a plurality of connector elements is provided;
said connector element forms part of said plurality of connector elements;
said connector elements of said plurality of connector elements are of substantially equal design;
said connector elements of said plurality of connector elements connect said optical element and said optical element holder; and
said connector elements are substantially equally distributed over said outer circumference of said optical element.

24. The optical element unit according to claim 20, wherein said optical element does not directly contact said optical element holder.

25. A method, comprising:
providing a microlithography optical element unit comprising an optical element, a plurality of connector elements and an optical element holder, said optical element having a plane of main extension as well as an outer circumference and defining a radial direction; and
connecting said optical element and said optical element holder exclusively via said connector elements, each of said connector elements having a first connector part connected to said optical element at said outer circumference and a second connector part connected to said optical element holder,
wherein:
said first connector part and said second connector part are connected via at least one coupling part arranged kinematically in series between said first connector part and said second connector part so as to provide compliance in said radial direction and to substantially prevent rotation between said first connector part and said second connector part in a plane substantially parallel to said plane of main extension;
said at least one coupling part is substantially rigid in a direction perpendicular to said plane of main extension of said optical element; and
said at least one coupling part is a parallel guide configured to provide parallel guidance of said first connector part relative to said second connector part along said radial direction in said plane substantially parallel to said plane of main extension.

26. The method according to claim 25, wherein said first connector part, along said radial direction, is guided in parallel relative to said second connector part.

27. The method according to claim 21, wherein said optical element does not directly contact said optical element holder.

28. A method comprising:
providing a microlithography illumination system providing light of a light path;
providing and locating a mask within said light path;
providing and locating a substrate at an end of said light path;
providing and locating a microlithography optical projection system within said light path between said mask and said substrate;
supporting at least one optical element of at least one of said microlithography illumination system and said microlithography optical projection; and
transferring an image of said pattern formed on said mask onto said substrate using said microlithography illumination system and said microlithography optical projection system,
wherein:
said method of supporting an optical element comprises:
providing a microlithography optical element unit comprising said optical element, an optical element holder and a plurality of connector elements, said optical element having a plane of main extension as well as an outer circumference and defining a radial direction; and
connecting said optical element and said optical element holder exclusively via said connector elements,
wherein:
each of said connector elements has a first connector part connected to said optical element at said outer circumference and a second connector part connected to said optical element holder;
said first connector part and said second connector part are connected via at least one coupling part arranged kinematically in series between said first connector part and said second connector part so as to provide compliance in said radial direction and to substantially prevent rotation between said first connector part and said second connector part in a plane substantially parallel to said plane of main extension;

said at least one coupling part is substantially rigid in a direction perpendicular to said plane of main extension of said optical element; and said at least one coupling part is a parallel guide configured to provide parallel guidance of said first connector part relative to said second connector part along said radial direction in said plane substantially parallel to said plane of main extension.

29. The method according to claim 28, wherein said supporting at least one optical element comprises supporting said optical element such that said plane of main extension is inclined with respect to a horizontal plane.

30. The method according to claim 28, wherein said optical element does not directly contact said optical element holder.

31. An optical element unit comprising:
an optical element;
a plurality of connector elements; and
an optical element holder,
wherein:
said optical element has a plane of main extension as well as an outer circumference and defines a radial direction;
said optical element is connected to said optical element holder exclusively by said connector elements;
each of said connector elements has a first connector part connected to said optical element at said outer circumference and a second connector part connected to said optical element holder;
said first connector part and said second connector part are connected via at least one coupling part arranged kinematically in series between said first connector part and said second connector part;
said at least one coupling part is compliant in said radial direction and is configured to substantially prevent rotation between said first connector part and said second connector part in a plane substantially parallel to said plane of main extension;
said at least one coupling part is substantially rigid in a direction perpendicular to said plane of main extension of said optical element;
said first connector part surrounds said second connector part; and
said optical element unit is a microlithography optical element unit.

32. The optical element unit of claim 31, wherein said first connector part surrounds said at least one coupling part.

33. The optical element unit of claim 31, wherein said first connector part has an annular shape.

34. The optical element unit of claim 31, wherein said first connector part has an annular shape, said first connector part surrounds said second connector part, and said first connector part surrounds said at least one coupling part.

35. The optical element unit of claim 31, wherein said at least one coupling part is a parallel guide configured to provide parallel guidance of said first connector part relative to said second connector part along said radial direction.

36. The optical element unit according to claim 31, wherein said optical element does not directly contact said optical element holder.

37. An optical element unit comprising:
an optical element;
a plurality of connector elements; and
an optical element holder,
wherein:
said optical element has a plane of main extension as well as an outer circumference and defines a radial direction;
said optical element is connected to said optical element holder exclusively by said connector elements;
each of said connector elements has a first connector part connected to said optical element at said outer circumference via an adhesive bond;
each of said connector elements has a second connector part connected to said optical element holder;
said first connector part and said second connector part are connected via at least one coupling part arranged kinematically in series between said first connector part and said second connector part;
said at least one coupling part is compliant in said radial direction and is configured to substantially prevent rotation between said first connector part and said second connector part in a plane substantially parallel to said plane of main extension;
said at least one coupling part is substantially rigid in a direction perpendicular to said plane of main extension of said optical element; and
said optical element unit is a microlithography optical element unit.

38. The optical element unit according to claim 37, wherein said optical element does not directly contact said optical element holder.

39. An optical element unit comprising:
an optical element;
a connector element; and
an optical element holder,
wherein:
said optical element has a plane of main extension as well as an outer circumference and defines a radial direction;
said connector element connects said optical element and said optical element holder;
said connector element has a first connector part connected to said optical element at said outer circumference and a second part connected to said optical element holder;
said first connector part and said second connector part are connected via at least one coupling part;
said at least one coupling part is compliant in said radial direction and is configured to substantially prevent rotation between said first connector part and said second connector part in a plane substantially parallel to said plane of main extension;
said at least one coupling part is substantially rigid in a direction perpendicular to said plane of main extension of said optical element;
said at least one coupling part is a parallel guide configured to provide parallel guidance of said first connector part relative to said second connector part along said radial direction;
said at least one coupling part comprises a first linking element and a second linking element;
said first linking element links said first connector part and said second connector part;
said second linking element links said first connector part and said second connector part;
said first linking element comprises a first flexure located adjacent to said first connector part and a second flexure located adjacent to said second connector part;

said second linking element comprises a third flexure located adjacent to said first connector part and a fourth flexure located adjacent to said second connector part;

said first, second, third, and fourth flexures define the edges of a parallelogram; and said optical element unit is a microlithography optical element unit.

40. The optical element unit according to claim 39, wherein said first linking element and said second linking element are substantially parallel.

41. The optical element unit according to claim 39, wherein:

said first linking element comprises a first leaf spring element;

said second linking element comprises a second leaf spring element; and said first leaf spring element and said second leaf spring element are substantially parallel.

42. The optical element unit according to claim 39, wherein at least one of the following conditions holds:

said first linking element comprises a first middle portion located between said first flexure and said second flexure, said first middle portion having a bending resistance in a plane parallel to said optical element plane that is larger than the bending resistance of said first flexure and said second flexure in said plane parallel to said optical element plane; and said second linking element comprises a second middle portion located between said third flexure and said fourth flexure, said second middle portion having a bending resistance in a plane parallel to said optical element plane that is larger than the bending resistance of said first flexure and said second flexure in said plane parallel to said optical element plane.

* * * * *

UNITED STATES PATENT AND TRADEMARK OFFICE
CERTIFICATE OF CORRECTION

| | | Page 1 of 1 |
|---|---|---|
| PATENT NO. | : 9,134,501 B2 | |
| APPLICATION NO. | : 11/901131 | |
| DATED | : September 15, 2015 | |
| INVENTOR(S) | : Dirk Schaffer et al. | |

It is certified that error appears in the above-identified patent and that said Letters Patent is hereby corrected as shown below:

IN THE SPECIFICATION

Col. 11, line 18, before "holding", delete "a".

Col. 11, line 38, delete "provided" and insert -- provide --.

IN THE CLAIMS

Col. 20, line 33, Claim 27, delete "claim 21," and insert -- claim 25, --.

Col. 22, line 44, Claim 39, after "second", insert -- connector --.

Signed and Sealed this
Sixteenth Day of February, 2016

Michelle K. Lee
*Director of the United States Patent and Trademark Office*